(12) United States Patent
Dubois et al.

(10) Patent No.: US 7,747,341 B2
(45) Date of Patent: Jun. 29, 2010

(54) METHOD AND DEVICE FOR THE PRODUCTION OF A THREE-DIMENSIONAL MULTI-MATERIAL COMPONENT BY MEANS OF INK-JET-TYPE PRINTING

(75) Inventors: Martine Dubois, Limoges (FR); Rémi Noguera, Limoges (FR); Thierry Chartier, Feytiat (FR); Maksoud Oudjedi, Limoges (FR)

(73) Assignee: Centre National de la Recherche Scientifique (C.N.R.S.), Paris (FR)

( * ) Notice: Subject to any disclaimer, the term of this patent is extended or adjusted under 35 U.S.C. 154(b) by 1070 days.

(21) Appl. No.: 10/569,555

(22) PCT Filed: Aug. 17, 2004

(86) PCT No.: PCT/FR2004/002150

§ 371 (c)(1),
(2), (4) Date: Apr. 27, 2006

(87) PCT Pub. No.: WO2005/023523

PCT Pub. Date: Mar. 17, 2005

(65) Prior Publication Data

US 2008/0192074 A1     Aug. 14, 2008

(30) Foreign Application Priority Data

Aug. 29, 2003 (FR) .................................. 03 10300

(51) Int. Cl.
*G06F 19/00* (2006.01)
*G05B 13/02* (2006.01)
*B41J 29/38* (2006.01)
*B41J 2/015* (2006.01)

(52) U.S. Cl. ........................ 700/119; 700/171; 700/173; 700/175; 700/182; 700/186; 700/193; 700/208; 700/28; 347/6; 347/14; 347/17; 347/20; 347/22; 347/84; 347/102

(58) Field of Classification Search ............. 700/28–31, 700/49, 98, 118–120, 163, 171, 173, 175, 700/182–184, 186, 193, 208; 347/5, 6–9, 347/14, 17, 20, 22, 23, 33, 34, 49, 84, 102
See application file for complete search history.

(56) References Cited

U.S. PATENT DOCUMENTS 6,401,002 B1 * 6/2002 Jang et al. .................... 700/119
6,612,824 B2   9/2003 Tochimoto et al.

* cited by examiner

*Primary Examiner*—Sean P Shechtman
(74) *Attorney, Agent, or Firm*—Young & Thompson

(57) ABSTRACT

Producing a three-dimensional multi-material component whereby successive layers of at least one material are printed by a drop ink-jet-type printer including cutting a representation of the multi-material component into remarkable objects; cutting the representation of the component into print layers, as a function of the remarkable objects; for each print layer, establishing a plurality of discrete spatial print path trajectories; for each print layer and for each discrete spatial trajectory, establishing an assembly of printing parameters which are dependent on the nature of the deposited materials and the deposition conditions thereof; and establishing a rule for the spatial and temporal sequencing of the print path of the print layers and of the discrete spatial trajectories as a function of the objects, the relative three-dimensional arrangement thereof and the characteristics of the printing device.

13 Claims, 7 Drawing Sheets

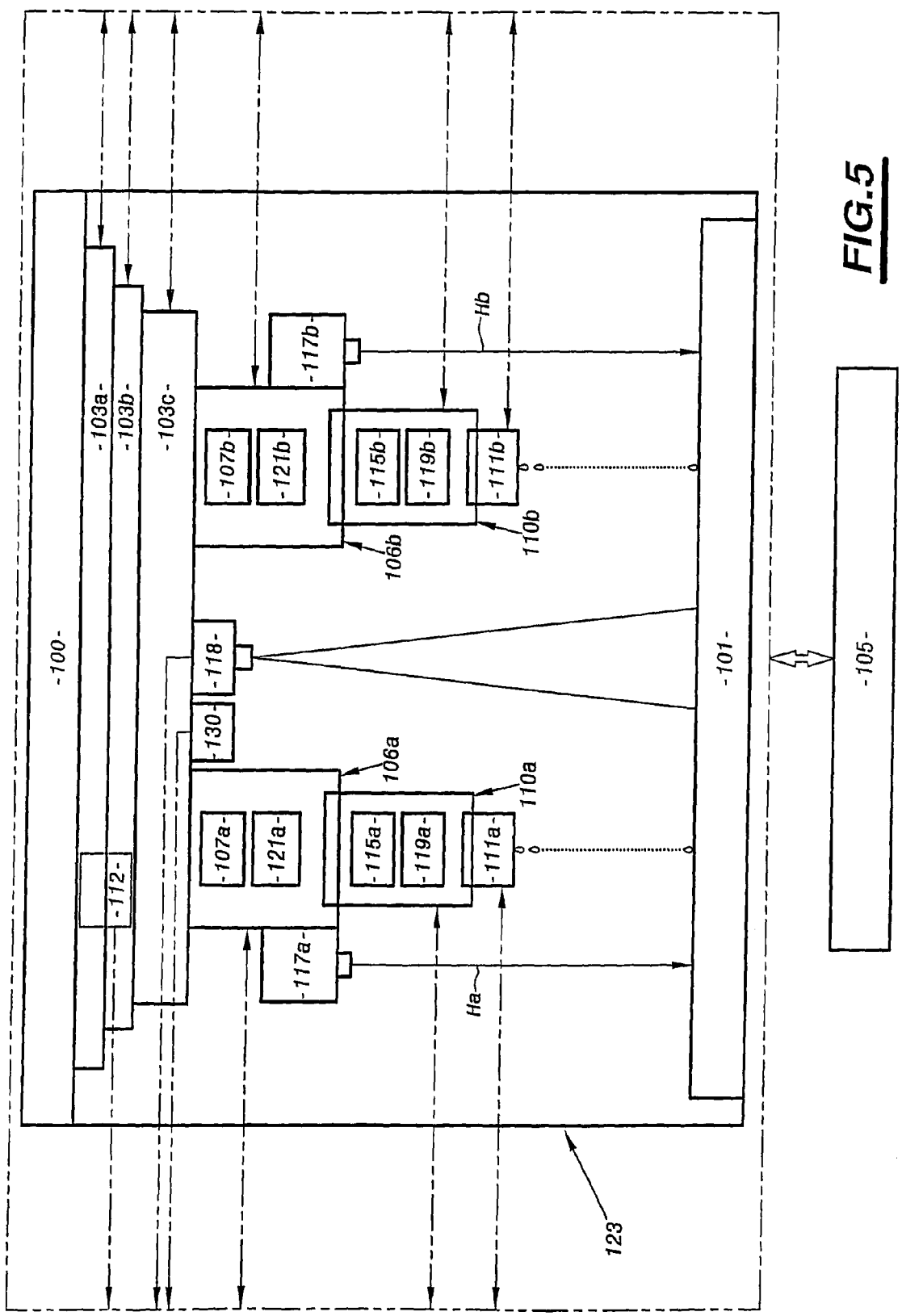

METHOD AND DEVICE FOR THE PRODUCTION OF A THREE-DIMENSIONAL MULTI-MATERIAL COMPONENT BY MEANS OF INK-JET-TYPE PRINTING

The present invention relates to a method and a device for producing three-dimensional multi-material components by ink-jet-type printing of successive layers.

The production of structures by ink-jet-type printing arose from the need to produce multi-material objects of complex shapes quickly and easily with high definition. Based on computer-aided design, this production allows the manufacture of objects by successive additions of materials without employing a moulding stage and without using tools, and is a non-substractive production method, in other words a production method without removal of material to obtain the desired structure.

Its high precision and the possibilities which it affords in terms of definition are beneficial for numerous sectors of industry focusing on the segments of microcomponents such as microelectronics and microsystems.

It is possible to mention, for example, the field of medicine and the production of ultrasonographic probes produced from composite ceramic/polymer rods having connectivity of 1-3, the performance of which depends on the size, quality and density of integration of ceramic rods forming them.

The production of multi-material components by ink-jet-type printing poses several problems which can generally be classified in three categories.

The first category relates to the nature of the materials used during production, the second to the properties of the printer and the third to the method of computer-aided design employed, each category having a direct influence on the quality of the component produced.

The nature of the materials, in particular of the ceramic systems, characterised by their properties of homogeneity, ceramic particle size, rheological properties, etc. influences the way in which droplets to be ejected will be formed, their impact on and spread over the deposition surface and the possible evaporation of the solvent which they contain. They also act directly on the relative arrangement of particles in the component produced.

Poorly or imprecisely defined characteristics can therefore limit the quality of the produced component in terms of cohesion and fragility, definition of precision or mechanical characteristics of its constituent parts, for example.

The nature of the materials is also important with regard to the printer employed.

Conventionally, a printer comprises means for the storage, flow and ejection of materials as well as displacement means for ejecting product to the desired positions.

Assuming that ceramic systems have characteristics that are detrimental to the printer, for example undesirable sedimentation which is likely to lead to obstruction of flow channels, this printer cannot operate satisfactorily or may even break down. This leads to the production of inferior components, regardless of the precision of which this device is capable. This is why it is important to control the nature of the materials in the printer in order to provide materials having the properties required for printing and to use the various functions of the printer optimally.

Obviously the quality obtained in a component does not depend solely on appropriate control of the nature of the materials to be ejected.

Even for optimum management thereof, if the device does not allow, for example, the precision of execution required by the production specification, it is impossible to produce a high-quality component which complies with the requirements thereof.

The precision of execution is obviously directly linked to the precision of displacement and the material ejection conditions, but also to the way in which they are controlled. Thus, for example, it is irrelevant that the device is capable of forming droplets of material having a diameter of 10 µm if these droplets are ejected at the wrong position or at the wrong distance from the deposition surface.

Thus, not only the nature of the materials used for production but also the deposition conditions thereof must be appropriately selected.

Problems associated with computer-aided design of the object to be produced also occur. Computer-aided design conventionally consists in cutting up a representation of the object to be produced in successive print layers and defining for each layer patterns which are to be printed by the printer. Computer-aided design which does not allow for the properties of the device and the properties of the materials does not allow optimum definition of the patterns to be printed.

Finally, taking the above-described problems into account in isolation limits the quality of the object to be produced because this quality depends on all the related parameters which are representative of the nature of the ceramic systems used, the properties of the printer and the computer-aided design.

The literature discloses devices for producing multi-material components by ink-jet-type printing such as those described in the articles by M. Motte et al, J. Am. Ceram. Soc., 80[2], 1997, 486-494 and J. H. Song et al, Journal of Materials Science No. 37 (2002). However, each article only deals with the aforementioned problems in part and substantially independently.

Thus, although the first device has an adjustable ejection height, this is controlled manually at the start of printing. The impact of the droplets is therefore poor, and the ejection and deposition conditions thereof adversely affect the structure of the component to be produced. In addition, although this document addresses the rheological problems, surface tension and drying rate, it does not provide a solution which allows control of the ejection conditions as a function of these parameters in order to obtain a good quality of product to be ejected.

The second document presents an ink-jet-type printer comprising a multitude of ejection nozzles for producing matrices of ceramic rods. These nozzles are disposed in lines and the device has only one degree of freedom in the printing plane. In addition, the problems of surface tension, viscosity and sedimentation are solved by a system causing the materials to have a back and forth motion in the ejection head at predetermined moments, so that said characteristics of material deposition and of the deposited material are not controlled between two predetermined instants. Therefore, the quality of ejection is not controlled continuously over time.

The object of the present invention is to solve the aforementioned problems by proposing a method and a device for production by ink-jet-type printing which allow production of three-dimensional structures consisting of a plurality of different materials.

The device according to the present invention also allows micrometer precision in production and this allows high-definition structures to be obtained.

The present invention accordingly relates principally to a method for producing a three-dimensional multi-material component by the ink-jet-type printing of droplets of at least one material in successive layers, characterised in that it comprises at least the stages consisting of:
- cutting up a representation of the multi-material component into characteristic objects;
- slicing the representation of the component into print layers as a function of said characteristic objects;
- establishing a plurality of discrete spatial print path trajectories for each print layer;
- establishing a set of printing parameters as a function of the nature of the materials deposited and the deposition conditions thereof for each print layer and for each discrete spatial trajectory;
- establishing a spatial and temporal sequencing law for the print path for said print layers and for said discrete spatial trajectories as a function of the objects, their relative three-dimensional arrangement and the characteristics of the printer, in order to optimise the process of depositing each print layer.

The present invention also relates to a device for producing a multi-material component by the ink-jet-type printing of droplets of at least one material in successive layers, characterised in that it comprises:
- independent means for three-dimensional displacement in three reference directions;
- material droplet ejection means which are integral with the three-dimensional displacement means and are controlled in terms of temperature, pressure and size and shape of ejected droplets;
- means for storing and conditioning the materials, adapted to control the temperature, pressure and state of dispersion of the materials and connected to the ejection means;
- a data processing unit comprising at least:
  - a module for computing and determining characteristic objects of a representation of said multi-material component to be produced and successive print layers on the basis of said characteristic objects;
  - a module for establishing, for each print layer, a plurality of discrete spatial print path trajectories and a spatial and temporal sequencing law for said print layers and said discrete spatial trajectories;
  - a module for establishing, for each layer and each discrete spatial trajectory, a set of printing parameters;
  - a module for monitored control of said independent three-dimensional displacement means, said means for storing and conditioning the materials and said material droplet ejection means, in order to optimise multi-material component production;
  - three-dimensional displacement measuring means and printing parameter measuring means connected to the data processing unit;
  - means for synchronising the three-dimensional displacement and ejection of materials as a function of the sequencing law.

The present invention also relates to a device for storing a material for a device for production by ink-jet-type printing, characterised in that it comprises, in the vicinity of the material outlet orifice: a system for delivery of this material, the opening of said delivery system being controlled, stirrer means and temperature and pressure control means for the stored material, in order to optimise the state of the material in the vicinity of the outlet orifice thereof.

The present invention also relates to an ejection head for a material for a device for production by ink-jet-type printing, characterised in that it comprises a material tank, temperature control means for the material stored in said tank, pressure control means for the material in said tank and cleaning means for the material discharge pipe.

The present invention will be understood better on reading the following description given by way of example with reference to the accompanying drawings, in which:

FIG. 5 is a basic diagram of a printer according to the invention;

Figure 1:
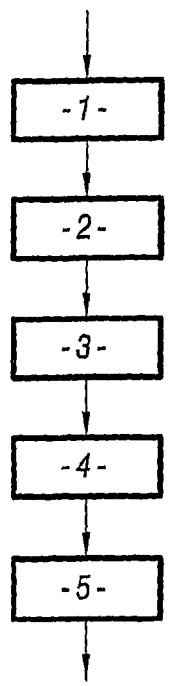
FIG. 1 is a block diagram of some of the stages of the method according to the invention.

Before describing embodiments of the method and the device according to the invention in greater detail, some definitions will first be provided to assist understanding of the following description.

Conventionally, the sets in the field of production by ink-jet-type printing are arranged hierarchically. 'The component' denotes the total structure produced during a complete production process. A component may be formed from one or more parts. For example, the production of a component can consist in the production of a series of several ultrasonographic probes or in the production of one ultrasonographic probe and one micromotor. Each part is composed of one or more objects. For example, an ultrasonographic probe comprises ceramic rods which each form an object of the probe. Finally, each object consists of characteristic zones, for example the core which forms the core of the object, the skin which forms the outer layer of the object apart from the sheath, and the sheath which corresponds to the layer of the object in contact with the printing environment during production, in particular the printing table of the printer or else the air if the multi-material component is produced in the open air.

As will be explained in greater detail hereinafter, the method according to the invention considers a smaller number of sets and subdivisions as it employs only two divisions of the component: a division of the component into "characteristic objects" defined as geometric and physico-chemical entities and division of a characteristic object into "print layers" defined as production entities in the course of the method according to the invention.

To determine the print layers, the embodiment of the method according to the invention produces "layers of object" which are obtained by slicing the 3D representation of the component into slices of equal thickness, and consequently slicing the characteristic objects, and which are used here to determine print layers.

A component is also characterised by a set of properties. These properties are obtained after a dynamic production process. The properties characterising the component once it has been produced will therefore be described as "static properties", in contrast to the dynamic production process. On the other hand, it is possible to control the dynamic production process via various control parameters which will be described as "printing parameters". Finally, the dynamic production process takes place in a particular environment. This environment is characterised by a set of properties which are described as "deposition conditions".

Conventionally, the production of a component is preceded by a stage of computer-aided design which involves producing a three-dimensional (hereinafter "3D") representation of this object on the basis of a specification assembling all the requirements and properties to be fulfilled thereby.

On the basis of this 3D representation and the specification, the method according to the invention determines a set of printing characteristics.

FIG. 1 is a block diagram of early stages of the method according to the invention employed when determining all the characteristics of the component production cycle. A first stage 1 of the method allows the 3D representation to be cut up into a set of characteristic objects. This set of characteristic objects is used, in a slicing stage 2 of the method, to slice the 3D representation of the component to be produced in order to obtain a set of print layers to be printed in succession. In a stage 3, the method allows a set of discrete spatial trajectories to be computed for each print layer. Stage 4 involves determining a set of printing parameters for each print layer and each spatial and temporal trajectory. The following stage 5 of the method consists in establishing a law of spatial and temporal sequencing of print path of the print layers and the discrete spatial trajectories thus determined.

Each of these stages will now be described in greater detail hereinafter.

Stage of Cutting Up the 3D Representation into Characteristic Objects

The first stage 1 of the method according to the invention is therefore the stage of cutting up the 3D representation of the component to be produced which involves cutting up the 3D representation of the component to be produced by ink-jet printing into characteristic objects. A characteristic object is defined by a set of geometric properties and physico-chemical properties taken in combination.

A geometric object is a region of the component which is spatially continuous, in other words in one piece. A physico-chemical object is a region of the component having a constant arrangement of particles exhibiting a particular microstructure and consisting of a single material. A characteristic object is both a geometric object and a physico-chemical object. Each of the characteristic objects of a component and the properties defining it are determined when defining the production specification for the multi-material component to be produced.

Figure 2:
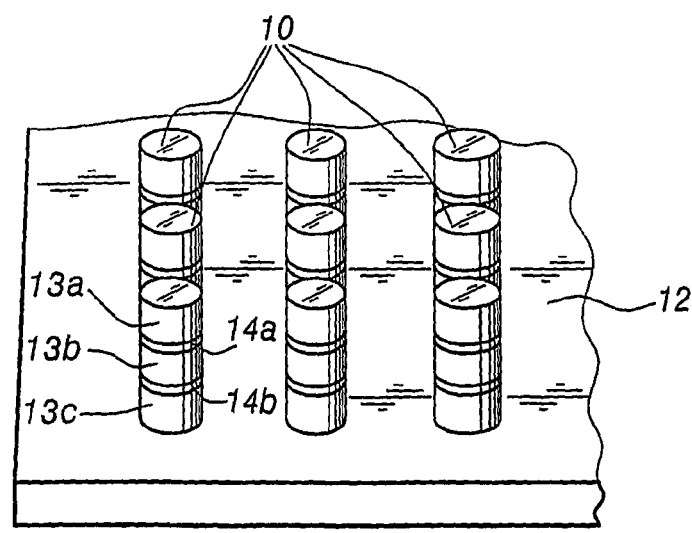
FIG. 2 is a perspective view of a multi-material component used in the formation of an ultrasonographic probe.

FIG. 2 is a perspective view of an element used in the formation of an ultrasonographic probe, namely a network 10 of rods. Each of the rods consists of an alternation of layers of a ceramic material 13a, 13b, 13c, for example of PZt, which is selected for its piezoelectric properties, and layers of a conductive material 14a, 14b, for example a silver/palladium alloy which forms an electrode. The method identifies the characteristic objects of this 3D representation and cuts it up accordingly.

For example, assuming that the rod network 10 is composed of nine rods, a total of 45 characteristic objects may thus be obtained. On the hypothesis that the various layers of material making up the rods of the network 10 of rods each have a constant arrangement of particles, eighteen objects correspond to each of the layers of conductive material making up the rods and 27 objects correspond to the layers of ceramic material making up the rods.

Each of the aforementioned objects can again be cut up, if necessary, in other words demanded by the production specification and/or the production process, into three objects having different mechanical properties, and hence the hypotheses introduced above. The peripheral layer of these objects is not subjected to the same constraints, for example mechanical and/or thermal constraints, as the portion forming the core. One difference, for example, is the fact that the peripheral layer is in contact with the ambient air, if this network is produced in the open air. In addition, the peripheral layer can have a specific function, such as that of forming a production space for the core of the object, and this means that it must possess different properties from those of the core.

Thus, it is also possible to distinguish three characteristic objects for each of the objects described above: the free portion, the portion or portions in contact with another material and the portion forming the core (skin, sheath and core respectively). If the production specification and/or the production process demand specific properties for each of these regions, the method according to the invention allows them to be identified and allows the 3D representation to be cut up as a result.

Once the 3D representation of the component has been cut up, the method has a set of characteristic objects with which are associated sets of geometric and physico-chemical properties defining them.

However, these properties are static properties which define the component once it has been produced. Now, these properties are obtained as the result of a dynamic production process and depend on the physico-chemical characteristics of the materials which have already been deposited or are to be deposited, the characteristics of the printer used to produce the component and the characteristics of interaction between the materials and the printer used for production.

For example, if a droplet of material is deposited on a so-called deposition surface, the material contained in the droplet will spread and this is a dynamic process. The more pronounced is the spread of a deposited droplet and the smaller is the thickness of material finally obtained for a deposited droplet and vice versa, and this consequently affects the final arrangement of the particles of deposited materials, which is a static property. The physico-chemical characteristics of the materials used for production can also affect the size and shape of the droplets ejected by the ejection means of the printer. For example, with a specific ejection nozzle, it will be impossible to eject droplets of a material having a diameter of less than 20 μm, thus resulting in a minimum volume of material which can be deposited by each ejected droplet.

Similarly, the ejection height, defined as being the orthogonal distance to the deposition surface between the deposition surface and the ejection nozzles, of the droplets also plays a decisive part. This height in part determines the characteristics of the impact of the droplets on the deposition surface and therefore the initial shape of the droplet on the deposition surface, as well as the initial dispersion of the material on the deposition surface. If this ejection height is not controlled, control of the impact is thus restricted.

The method according to the invention thus allows the above-defined factors to be taken into consideration in order to optimise printing. It is possible to influence some of these factors by controlling certain parameters concerning the state of the materials and of the printer. Thus, by controlling the temperature of the material in the ejection means and therefore during ejection of the droplets of material, the evaporation thereof and the viscosity thereof when it makes contact with the support and consequently the spread of the deposited droplets are controlled. If the temperature in the ejection means is controlled, moreover, the ejection means may be used in their state of optimum operation. Similarly, it is particularly advantageous to control parameters of the device such as the ejection height or the volume of the ejected droplets.

The controllable parameters, whether they are parameters concerning the state of the materials or parameters concerning operation of the printer, consequently form the printing parameters.

All of the properties, parameters, characteristics, factors relating to the materials, to the printer and to the environment, which influence the above-described factors but which cannot be controlled, in turn constitute the deposition conditions. This applies in particular to the size and arrangement of the pipes of the device. When considering the ejection of a particular droplet, it can also concern the nature of the deposition surface which, for this ejection under consideration, is fixed and cannot be changed.

Once all of the characteristic objects of the component to be produced have been determined, the method allows identification of all of the printing parameters which are to be controlled in order to obtain the desired static properties of the component to be produced under predetermined deposition conditions.

Stage of Slicing the 3D Representation of the Component

The following stage 2 of the method is the stage of slicing the 3D representation of the component into print layers and involves slicing the 3D representation of the component to be produced into print layers which are to be printed in succession. This slicing is carried out as a function of the characteristic objects and their desired static properties and as a function of the dynamic characteristics of the printing process which, once stabilised, ensures the required static properties of the component. This stage involves maximising the thickness of the print layers in order to achieve production which is as fast and as homogeneous as possible.

The slicing stage firstly allows the 3D representation of the component to be positioned in a production volume. For example, this may be a representation of the region of the space attainable by the ejection means. This volume conventionally includes a plan which is representative of the plan of the printing table of the printer on which the 3D representation is positioned. This printing volume is marked by an orthogonal reference frame formed by three axes X, Y and Z which are each a representation of an axis of displacement of the ejection means of the printer according to the invention, as will be described in greater detail hereinafter, and of which the origin may be, for example, representative of a rest position of the ejection means. A preferential axis is thus selected in order to determine the direction in which printing will be carried out, in other words the direction of superimposition of the printing layers, and therefore the slicing direction, for example the axis Z. In the following description, the thicknesses will be considered along this printing axis Z.

The slicing stage then consists in defining a minimum thickness of print layer. This is the argument h* of the optimisation problem according to the equation:

$$h^* = \underset{i}{\operatorname{argmin}}(\max(\min(h_i/C_i), h_i^*))$$

where i is the integer representing the $i^{th}$ characteristic object of the component to be produced, $h_i$ is the thickness of material that can be deposited for the $i^{th}$ object such that the static properties $C_i$ desired for this object are satisfied, and $h^*_i$ is the minimum thickness that the device can deposit for the material entering the constitution of this $i^{th}$ object.

In order to determine the values $\min(h_i/C_i)$, in other words the minimum thickness for achieving the property $C_i$, it is possible to carry out preliminary investigations and to store the results of these investigations in a database and load them when carrying out this stage of determining the minimum print thickness. If such investigations have not been carried out, this problem is solved by putting forward heuristics commonly used in the field of production of components by ink-jet printing, for example heuristics such that $\min(h_i/C_i) = h_i^*$ or $\min(h_i/C_i)$ is the smallest thickness of the characteristic object when the thickness is approximately $h_i^*$.

It should be noted that the method allows for the flexibility offered by the printer for depositing thicknesses of materials in a broad thickness range so that this minimum thickness h* of print layer is a thickness which can be deposited for each material. For this, $h^*_i = k_i \times \bar{h}$ is selected, where $k_i$ is a natural integer greater than or equal to one and $\bar{h}$ is a depositable thickness for all the materials used in production of the component, whatever the $i^{th}$ object constituting the component to be produced. This condition may thus be introduced into the above-mentioned optimisation problem.

This shows the benefit of the ink-jet printing method according to the invention, which allows for the properties of the device in order to optimise as far as possible the production of multi-material components.

The method according to the invention allows ranges of admissible values for printing parameters to be associated with each characteristic object determined during the stage of cutting up the 3D representation of the component. These ranges are determined for the component and predetermined deposition conditions as a function of the desired static properties. These ranges relate, in particular, to the deposited volume of materials on the deposition surface or, on an equivalent basis viewed from the printer, to the size and shape of the ejected droplets of material, the ejection height of the droplets relative to the deposition surface, the distance separating two successive ejections of droplets of material, the temperature and pressure of the materials during ejection. These ranges are determined in such a way that, whatever the values of printing parameters selected therein, the static properties desired for the object are satisfied under predetermined deposition conditions.

These ranges of parameters can originate from earlier investigations, can be stored in a database and can be loaded during or prior to the slicing stage. These ranges can also be defined by users of the method and device according to the invention as a function of their know-how and loaded by them during the slicing stage or on initialisation of the method by incorporating them, for example, into the specification of the multi-material component to be produced. It should be noted that a proportion or all of these ranges of printing parameters may be reduced to a set of points, and this means that, under predetermined deposition conditions, the obtaining of the static properties necessitates a single value for all or some of the printing parameters.

The ejection of droplets of materials for a set of values of printing parameters selected in this set of ranges induces a particular spread of the deposited droplets and consequently a final thickness of deposited material. Thus the image of this set of ranges of printing parameters by the ejection process followed by the deposition or impact process and the process of spreading and drying the droplets of material is a range of thickness of depositable material.

Whatever the $i^{th}$ characteristic object constituting the component to be produced, a value of maximum thickness $e_i$ of depositable material and a thickness range defined by $[h_i^* e_i]$ can be associated. It is mentioned that $e_i$ is the value $\min(E_i, e_i^*)$ where $E_i$ is the maximum thickness of deposited material, such that the static properties are satisfied and $e_i^*$ the maximum thickness of material that can be physically deposited by the printer.

It is thus particularly advantageous to maximise the thickness of the thickness of material deposited during production of an object. By selecting the greatest possible thicknesses while ensuring that the static properties are satisfied, the printing time is thus shorter and this allows the production rate to be increased. The homogeneity of the deposited materials is also substantially improved.

The following stage of the method consists in slicing the 3D representation of the component into layers of equal thickness through a set of parallel planes in the production volume, spaced by the minimum thickness $h^*$ of print layer and orthogonal to the printing axis Z. A set of layers of characteristic object is thus obtained for each characteristic object.

The method then allows these layers of characteristic object to be assembled in print layers for each characteristic object as a function of the characteristics of the materials during the deposition thereof but also of the other objects, the relative three-dimensional disposition of the objects, the characteristics of the printer and the ranges of thickness of material that can be deposited.

Thus, for example, if an object has been sliced into ten object layers having a thickness of 10 µm and the maximum thickness of depositable material for this object is 50 µm, it is possible to assemble the first five object layers in a first print layer and the following five object layers in a second print layer. During production, the object will thus be produced in two stages by successive printing of two print layers, in other words printing of the first layer and then printing of the second layer.

However, the assembly of these object layers should allow for the characteristics of the materials used to make up the objects. For example, if the above-described object consists of a material which is very fluid when deposited, it may be necessary to construct beforehand a portion of the adjacent objects with the aim of forming a receptacle for this material, and this may make it necessary to define a first print layer having a thickness of less than 50 µm.

Similarly, if the thickness of the print layers is too great, the printing of these print layers can hinder subsequent production of the other objects because the ejection means no longer have access to the portion of space where the materials for producing these objects have to be deposited.

In addition, the thickness of a printing layer cannot be greater than or even equal to the distance separating the ejection means from the surface on which the print layer is to be printed, either due to a physical impossibility or due to a risk of poor deposition of material if the ejection means are substantially in contact with the print layer during the printing thereof.

Thus the aim of assembly of the object layers is to assemble a maximum of object layers together while allowing for the 3D multi-material component production characteristics, using a particular printer.

Stage of Determining Discrete Spatial Trajectories

The following stage 3 of the method is the stage of determining, for each print layer, a plurality of discrete spatial print path trajectories. It is the execution by printing of the discrete spatial trajectories of a print layer which produces this layer.

This stage consists in determining, for each print layer, a print path consisting of a set of discrete spatial trajectories of ejection points. For this purpose, this stage consists, in a first phase, of translating each print layer in distance between two successive ejections of droplets called "ejection step". The value of the ejection step for a print layer is selected in the previously defined range of ejection distance associated with the corresponding characteristic object of the component to be produced. The choice of this value of ejection step is made simultaneously with the choice of a volume of deposited material and therefore, viewed from the printer, of a size and shape of droplets, an ejection height, a temperature and a pressure exerted on the suspension of material during ejection of the material in the ranges of associated corresponding printing parameters, for obtaining said thickness during printing. This choice is also determined as a function of a degree of roughness desired for the surface of the print layer, which influences the spread and dispersion, and therefore the arrangement of particles, of the material which will subsequently be deposited on this layer.

These choices may be made so as to minimise the component production time and/or the complexity of the control laws required for operation of the printer used. From all the possible combinations of values of the printing parameters described hereinbefore, therefore, it is possible to select the one which is characterised by the greatest ejection step. This allows the displacement means to mark a minimised number of stops above the ejection points and therefore to increase the speed of production while ensuring the required static properties.

Once an ejection step has been determined for each print layer, the method involves then determining discrete spatial trajectories of ejection points for each print layer.

The method firstly consists in generating a mesh of the printing surface of said print layer. This mesh is a representation of the mesh of space induced by the printing unit displacement means. An ink-jet printer conventionally comprises displacement means which are actuated by step-by-step motors. Owing to the displacement by discrete unit of position of the device displacement means, the space is thus sampled spatially according to the displacement step or steps of the displacement means.

It should be noted that this sampling of the printing surface is not necessarily orthonormal. The displacement means may consist of unidirectional displacement means which travel along any axes and any displacement steps.

One embodiment of the method according to the invention consists in determining an ejection step, for each print layer, so that the ejection step can vary from one print layer to another in the same object.

However, the preferred embodiment of the method according to the invention involves selecting a single ejection step for all of the print layers of a characteristic object. This choice allows the displacement means to be controlled more easily and allows an increase in speed and reliability of production.

The method then involves determining the discrete spatial trajectories for satisfying the desired static properties but also for optimising the arrangement of material particles and the isotropy of the characteristic objects and of the component to be produced. An optimum arrangement of particles consequently leads to optimum cohesion of the objects and therefore of the finally obtained component which therefore has maximised mechanical strength. Isotropy is an important quality of a component because no direction is favoured in the component and this increases the mechanical strength of the component and avoids favoured shrinkage directions during sintering of the produced component.

Figure 3:
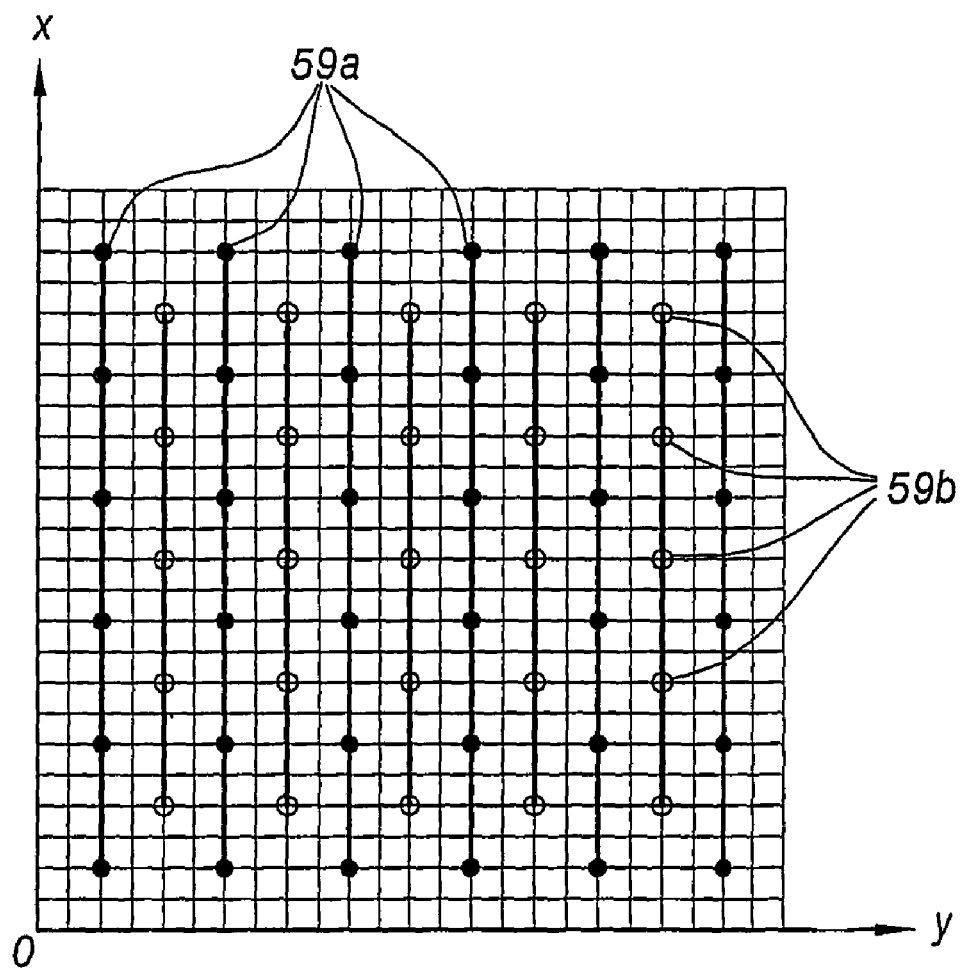
FIG. 3 shows a set of discrete spatial trajectories of a print layer obtained by the stage of determining discrete spatial trajectories of the method according to the invention.

The stage of determining discrete spatial trajectories of a print layer will now be described with reference to FIG. 3. FIG. 3 is an elevation of a print layer of a characteristic object of square section. This example has been selected to illustrate, in a simple manner, the stage of determining discrete spatial trajectories of a print layer. What is described below obviously applies to characteristic objects of any shape.

In a first phase, the method consists in defining a set 59a of discrete spatial trajectories which are characterised by a print path direction, in other words a displacement direction followed by the means of ejection during printing, and along the axis X in this example. A second set 59b of discrete spatial trajectories is then obtained by shifting the first set of discrete spatial trajectories by half an ejection step in the print path direction, the axis X in this case, and/or by a half increment in the direction orthogonal to the print path direction, the axis Y in this case. In the example in FIG. 3, the first set has been shifted in both directions. This shift is made possible because, in the printer according to the invention, the determined ejection steps are of two orders greater than the displacement step of the displacement means and therefore than the spatial sampling step of the printing surface such that, in a first approximation, any point of the printing surface can be reached. If this is not the case, the computation of the shift has to explicitly take into account the spatial sampling step of the printing surface. It also has to take into account the dimensions of the print section.

Figure 4A:
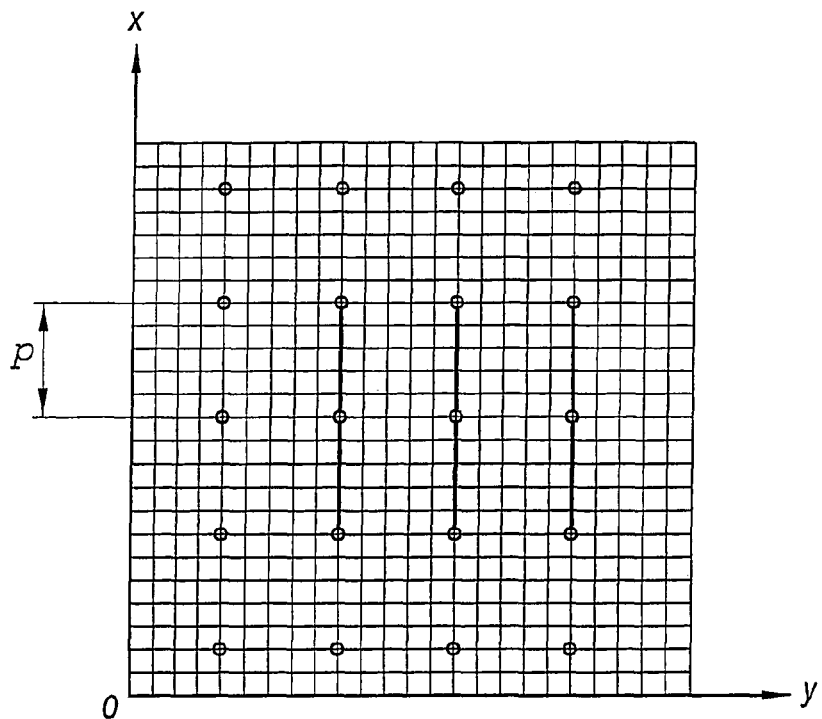
FIG. 4A is a set of discrete spatial trajectories of a print layer used to determine discrete spatial trajectories of the following print layer.
Figure 4B:
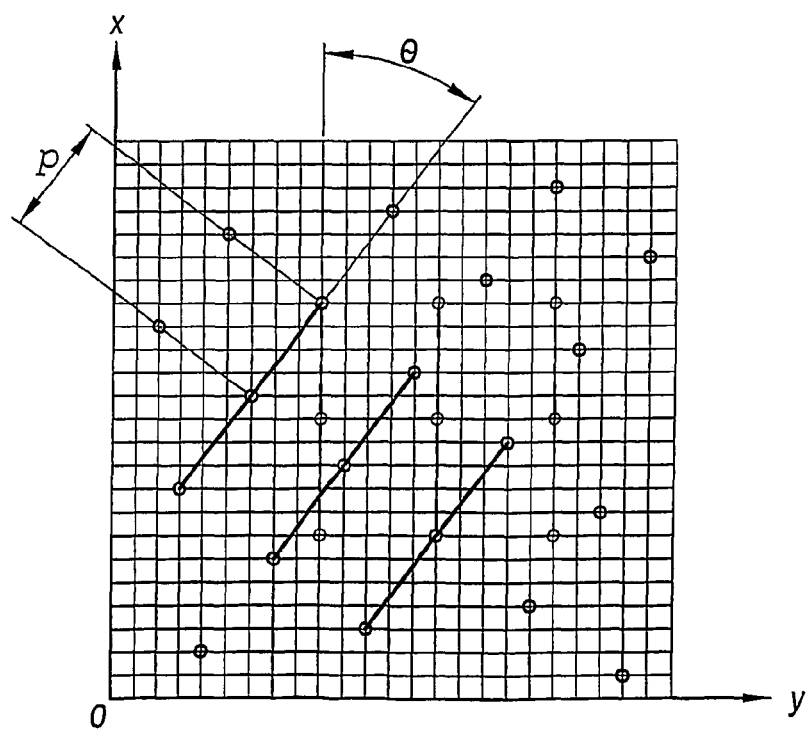
FIG. 4B is a set of trajectories of the following print layer obtained by the stage of determining discrete spatial trajectories of the method according to the invention on the basis of a rotation of the trajectories of layer 4A.

The method also involves determining, for each object, the trajectories of a print layer as a function of the trajectories of the previous print layer by determining a print path direction and/or a modulation of discrete spatial trajectories. FIGS. 4A and 4B show two print layers of an object which are to be printed successively. The first to be printed, shown in FIG. 4A, is provided with a set of discrete spatial trajectories characterised by a print path direction, along the axis X in this case, and an ejection step p. The discrete spatial trajectories of the following layer, shown in FIG. 4B, are obtained by applying a rotation of angle θ and of centre O, for example the origin of the orthogonal reference frame, to the printing direction for the preceding layer. It is particularly advantageous to determine print path directions which differ from one print layer to the next because this avoids favouring any particular direction in the object and therefore in the component and optimises the particle arrangement.

In addition, with an ejection step which is identical in two successive print layers, ejection points are obtained which are impossible to achieve by mere translation in the print path direction of the first layer, the axis X in this example, and/or in the direction orthogonal to the print path direction, the axis Y in this example, by a multiple of the ejection step. This has the effect of optimising the arrangement of particles without reducing the component production time. The angle of rotation θ is selected by merely dividing 360° by the number of print layers of the object concerned, if this angle is expressed in degrees.

It is also possible to modulate the ejection step from one layer to another in order, for example, to optimise the amount of product deposited per unit surface area. This modulation consists in multiplying the ejecting step of the preceding layer by a scale factor and/or shifting the discrete spatial trajectories of the current print layer by a half ejection increment in the print path direction, the axis X in this case, and/or by a half increment in the direction orthogonal to the print path direction, the axis Y in this case, in order to obtain the trajectories of the following print layer. Finally, it is possible to combine rotation of print path direction with modulation of the value of the ejection step and with the shift.

Stage of Determining Printing Parameters

The following stage 4 of the method allows a set of printing parameters to be established for each print layer and each discrete spatial trajectory. Some of these parameters, in particular the ejection height of the droplets of material and the volume of the droplets of material, have already been determined during the stage of determining the trajectory, as explained hereinbefore.

The method involves determining, for each of the materials, a set of parameters which control their state at different stages of the production process.

Firstly, the method involves determining, for each of the materials, a temperature, a pressure and a state of dispersion in the storage means as a function of its nature and its deposition conditions, in particular the arrangement of the ejection means. The object of this is, in particular, to preserve each material in a state of optimum preservation. Stirring enables the state of dispersion of the material to be controlled and the formation of particle agglomerates thus to be avoided, this property being important in the field of production by ink-jet printing, as particle agglomerates can adversely affect the quality of the produced component and can obstruct the ejection means. Control of the temperature and pressure of each of the materials in the storage means also allows the viscosity of the material to be controlled and favourably conditions the material for subsequent use in the ejection means.

The method also controls the state of each material in the ejection means and therefore prior to ejection, in particular the temperature and pressure, so that the ejection means are used in the optimum manner. The ejection of a material can then necessitate a specific temperature thereof during the ejection thereof. For example, if the temperature of the material is too high during ejection of a material, undesirable evaporation of solvent used in the constitution of the material and/or an unsatisfactory viscosity of the material can appear during formation of the droplets, thus modifying the characteristics of the deposition.

Once the material has been deposited, it can be left to evolve freely or this evolution can be controlled. By controlling, in particular, the temperature of the environment in which the material is deposited, for example the air surrounding the deposited material if production takes place in the open air, and therefore the temperature of the deposited material, it is possible to control evaporation of the solvent in a favourable manner, for example by controlling uniform and/or faster or slower evaporation. It is also possible to control other properties of the surrounding environment such as the pressure, the nature of the gas in which the materials are deposited or other properties with the aim of optimising evolution of the deposited material.

The method according to the invention thus allows the characteristics of the environment in which the component is produced to be determined, in particular by determining a temperature of the environment for each print layer.

Similarly, it may be necessary to subject the deposited material to a change of state. It may be necessary for a material to be in a first state in order to be correctly stored and/or ejected. However, the desired final state of this material may differ from this first state. The change of state of the material can be achieved by exposing it to appropriate radiation or to a predetermined temporal evolution of the temperature of the environment in which the component is produced. For example, by exposing specific ceramic systems to ultraviolet radiation, these systems are photopolymerised whereas other materials agglomerate when exposed to infrared radiation.

The method according to the invention thus allows the radiation characteristics leading to the desired final state of the materials to be determined, if necessary. For this purpose, the method involves determining a radiation wavelength and a radiation power for each material and therefore each print layer requiring such a treatment.

Finally, it should be remembered that the ejection height of the droplets of material, the volume thereof and the ejection increment have already been determined for each print layer and each discrete spatial trajectory.

It should be noted that determination of the printing parameters relative to the state of the materials can be executed simultaneously with the stage of determining the characteristic objects or during the stage of determining the spatial and temporal sequencing law.

Stage of Determining the Spatial and Temporal Sequencing Law

Following stage 5 of the method consists in establishing a spatial and temporal sequencing law of the discrete spatial trajectories. As already explained hereinbefore, it is sometimes necessary to print the print layers in a particular order as a function of the properties of the objects, their relative three-dimensional arrangement and the characteristics of the printer, and this is equivalent to executing discrete spatial trajectories in a particular order in printing.

In addition, specific materials necessitate a drying time and/or immobilisation of the ejection means, between each deposition of droplets of a single trajectory, in order to control the deposition of the ejected droplet more precisely. Two types of temporal law of droplet ejection and thus defined, namely a mode of ejection of droplets in flight and a mode of ejection of droplets point by point. In the mode of ejection of droplets in flight, the material droplets are ejected while the ejection means move. When possible, this mode of ejection is favoured because it increases the speed of production of the object. In the point by point mode of droplet ejection, a material droplet is deposited once the ejection means has become immobilised above the ejection point.

For each print layer, therefore, the method determines the mode of ejection of the discrete spatial trajectories as a function of the characteristics of the object concerned, in particular the state of the material during deposition and the desired static properties. The method also allows a speed of travel of the ejection means during execution of a discrete spatial trajectory by printing to be determined in order to take into account the drying time required between two successive ejections of droplets.

This stage of determining the sequencing law also allows a drying time required between the printing of two print layers to be determined. The order of printing of the print layers may be determined as the solution to a problem of minimising the total printing time for all of the print layers. For example, if the drying time required for a print layer is significant, it may be possible to print a print layer other than that which is to be superimposed onto the layer requiring a significant drying time. It is thus possible, for example, to employ an algorithm for seeking an optimum printing order for the layers which takes into account all of the printing characteristics of the print layers.

Finally, the stage of determining the spatial and temporal sequencing law allows ejection means cleaning sequences to be introduced into the spatial and temporal sequencing law, which minimises the likelihood of obstruction of the ejection means which may be difficult to detect, depending on the deposited materials and the deposition conditions thereof. For example, a cleaning sequence can be introduced after each sequence of printing five print layers.

The stages of the method which have just been described relate to the establishment of a set of characteristics and also consist in controlling these characteristics during production.

One stage of the method consists, during production of the component, of a stage of correcting printing errors which have occurred during printing of the layer which has just been printed.

Once the printing of a layer has been completed, morphological analysis of the deposition surface is carried out. This analysis comprises a stage of determining a representation of the deposition surface followed by a comparison of this representation with a desired reference representation. A differential representation corresponding to the printing errors and imperfections resulting from the printing of the layer which has just bee printed is thus obtained. As a function of this differential representation it is possible either to recalculate all the set of characteristics of the following layer or to introduce an additional print layer having given discrete spatial trajectories in order to locally correct the printing errors or the same discrete spatial trajectories as the layer which has just been printed. The last possibility is preferred as it allows rapid, satisfactory correction of the errors.

Indeed, experience has shown that the majority of errors originate from an inadequate deposited quantity of materials. Consequently, simple correction of the errors consists in depositing the missing quantity of materials.

The method will thus determine the volume of the necessary droplets to be ejected during execution of the discrete spatial trajectories of the additional layer in order to correct the errors. This new print layer is then printed and the process of analysis and correction is repeated until a satisfactory result is obtained.

The method according to the invention also consists in controlling the degree of obstruction of the ejection means. If this exceeds a predetermined threshold value, the quality of printing is no longer assured and it is necessary to clean the ejection means. As soon as such an obstruction is detected, the method consists in interrupting the printing which is underway, parking and cleaning the ejection means and then resuming printing from the state in which it was stopped. In an embodiment of the method according to the invention, a test is carried out to ascertain whether the missing quantity of material induced by the printing errors is greater than a predetermined threshold value, and if the result of this test is positive, obstruction of the ejection means is thus detected.

Finally, as described hereinbefore, the values of the printing parameters have been determined to satisfy the static properties of the component to be produced and the characteristics of the materials and the printer. The method according to the invention thus consists in controlling these parameters during production so that said given values of printing parameters are satisfied.

The following description relates to the ink-jet-type printer used in the production of multi-material components by the production method described hereinbefore. It will be described with reference to FIG. 5 to 8.

FIG. 5 is a basic diagram of the printer according to the invention. The device according to the invention comprises an immobile portion composed of a horizontal anti-vibration gantry 100 and a horizontal printing carrier 101. The function of the gantry is to keep the entire system rigid, attenuate mechanical disturbances, i.e. vibrations, and ensure high precision in parallelism with the horizontal carrier 101 on which the multi-material component is produced. The function of the carrier, apart from that of being a printing carrier, is also to attenuate mechanical disturbances, to ensure good planarity and to ensure high precision in parallelism with the gantry, over an operating temperature range representative of normal operating conditions.

The parallelism between the gantry and carrier is an important characteristic since the system 103a, 103b, 103c for displacement of the printer is fixed on the gantry. This displacement system allows three-dimensional displacement along three independent axes. It typically comprises three unidimensional displacement plates 103a, 103b, 103c, each plate travelling independently along its own axis. The three axes form an orthogonal reference frame. Two first axes for displacement of two first plates 103a, 103b are horizontal and form, optionally in combination with an identical displacement step for the two first plates 103a, 103b, a reference frame which is orthornormal for the printing plane, i.e. the upper plane 101a of the printing carrier. The third axis of the third plate 103c is orthogonal to the first two and is consequently vertical.

Each of these plates is actuated by a step-by-step motor, for example a high precision piezoelectric motor, the displacement step of which is approximately 100 nanometers. Each of the plates is controlled via a power controller (not shown) which is a conventional control component of step-by-step motors, by a data processing unit 105.

A plurality of material storage tanks 106a, 106b, with one tank per material used during the production of the multi-material component, is fixed on the displacement system. Each tank 106a, 106b comprises means 107a, 107b for controlling the state of the stored material, which stir the material and control the temperature and pressure thereof. These means ensure that the material is conditioned in optimum conditions of stirring, temperature and pressure. The means 107a, 107b for controlling the state of the stored material are connected to the data processing unit 105 adapted to control said means 107a, 107b for controlling the state of the stored material. A more detailed description of a tank according to the invention will be provided hereinafter.

Each tank is connected to ejection means comprising at least one ejection head 110a, 110b responsible for conditioning the material for the ejection thereof and at least one ejection nozzle 111a, 111b connected to the at least one ejection head 110a, 110b. This ejection head 110a, 110b provides the connection between the storage tank 106a, 106b to which it is connected and to the at least one ejection nozzle 111a, 111b connected thereto. It allows the temperature and pressure of the material to be controlled prior to ejection in order to satisfy not only the requirements for printing but also the requirements for the ejection nozzles 111a, 111b. Specific nozzles necessitate, for example for operation thereof, a predetermined material pressure. Each ejection head 110a, 110b therefore comprises temperature and pressure control means 115a, 115b for controlling the temperature and pressure of the material prior to the admission therefore into the ejection nozzles 111a, 111b. Said temperature and pressure control means 115a, 115b are connected to the data processing unit 105 adapted to control them.

In addition, each ejection head 110a, 110b comprises cleaning means connected to a cleaning liquid tank and adapted to clean the ejection head and to clean the at least one ejection nozzle connected thereto. An ejection head according to the invention will be described in greater detail later in the description.

Each ejection nozzle 111a, 111b allows the generation of material droplets. They may typically be nozzles which are activated by a diaphragm stimulated by a parallelepiped piezoelectric component, the voltage of said parallelepiped component being controlled. The shape and size of ejected droplets and consequently the volume of material deposited by such a nozzle depend on the voltage signal applied to the piezoelectric component thereof, in particular the amplitude and shape factor of the signal applied. In the printer according to the invention, each nozzle 111a, 111b is connected via a voltage amplifier (not shown) to the data processing unit 105 adapted to control it.

In addition, the printer according to the invention comprises a plurality of sensors and data acquisition means.

A first positioning sensor 112, preferably included in the displacement system, measures the position of the plates and therefore of the ejection means in the horizontal plane and is connected to the data processing unit 105. On the basis of these measurements and the discrete spatial trajectories to be printed, the data processing unit 105 employs a control law to minimise the error between the desired discrete spatial trajectories and the actually printed discrete spatial trajectories.

Second positioning sensors 117a, 117b measure the distances Ha, Hb, orthogonal to the deposition surface, between the ejection nozzles and the deposition surface. These sensors are connected to the data processing unit 105 which uses the measurements thereof to implement a control law for regulating the distances between the nozzle and the deposition surface Ha, Hb around predetermined nominal values. These second sensors 117a, 117b are preferably laser sensors which allow measurements of the order of the displacement step of the third vertical plate 103c.

A sensor 118 measures the morphological characteristics of the deposition surface and is connected to the data processing unit 105 which uses the measurements delivered by said sensor to determine a correction of printing errors. It should be noted that this sensor 118 can be at least one of the second positioning sensors 117a, 117b, for example, if a sensor of the laser type, of which the measurement precision is approximately the wavelength of the laser beam, is used.

Sets 119a, 119b of sensors for the temperature and pressure of the materials in the ejection heads, of which there is one per ejection head, measure the temperature and pressure of the materials in each ejection head 110a, 110b and are connected to the data processing unit 105 which uses the measurements delivered by said sets 119a, 119b of sensors for determining a law for driving the means 115a, 115b for controlling the temperature and pressure of the ejections head 110a, 110b.

Acquisition units 121a, 121b, of which there is one per storage tank, each comprise a temperature and pressure sensor and means for acquiring the state of dispersion, and measure the temperature, pressure and state of dispersion of the materials stored in the tanks 106a, 106b. Said acquisition units 121a, 121b are connected to the data processing unit 105 which uses these measurements delivered to it to control the means for controlling the temperature, pressure and state of dispersion of the materials stored in the tanks 106a, 106b.

The production device according to the invention further comprises means (not shown) for acquiring the degree of obstruction of the ejection nozzles which measure the degree of obstruction of the ejection nozzles 111a, 111b. The data processing unit 105 uses the measurements of the degree of obstruction to control the ejection head and ejection nozzle cleaning means. The means for acquiring the degree of obstruction of the ejection nozzles typically comprise the morphological characteristic sensor 118 and the data processing unit 105, as will be explained in greater detail hereinafter. When the data processing unit 105 determines that the missing quantity of material for a print layer which has just been printed, determined in the above-described manner, is greater than a predetermined threshold value, an obstruction of the ejection nozzles is thus diagnosed and the data processing unit 105 thus controls the ejection head and ejection nozzle cleaning means.

Otherwise, if the size of the ejected material droplets is sufficiently great, the means for acquiring the degree of obstruction of the ejection nozzles can comprise a CCD camera which detects the presence or absence of these droplets at predetermined instants of material droplet ejection. If these droplets are absent at the ejection instants, the data processing unit 105 then controls the ejection head cleaning means in order to clean the ejection heads and nozzles.

The printer according to the invention further comprises a hermetic chamber 123 which defines a totally isolated region in space in which the component is produced. For example, this chamber can contain all of the above-described means. This chamber comprises means for controlling the characteristics of the deposition environment, in particular the temperature thereof, which are connected to the data processing unit 105 for the control thereof. This chamber can also be adapted to control the pressure, hygrometry or else the nature of the ambient gas and can comprise all the means necessary for this purpose.

In addition, a radiation source 130 is also provided and is connected to the data processing unit 105. This radiation source can comprise lasers, infrared flash lamps or the like, which are adapted to emit the radiated wavelengths and powers necessary for a material to pass from a first state to a second desired final state.

Figure 6:
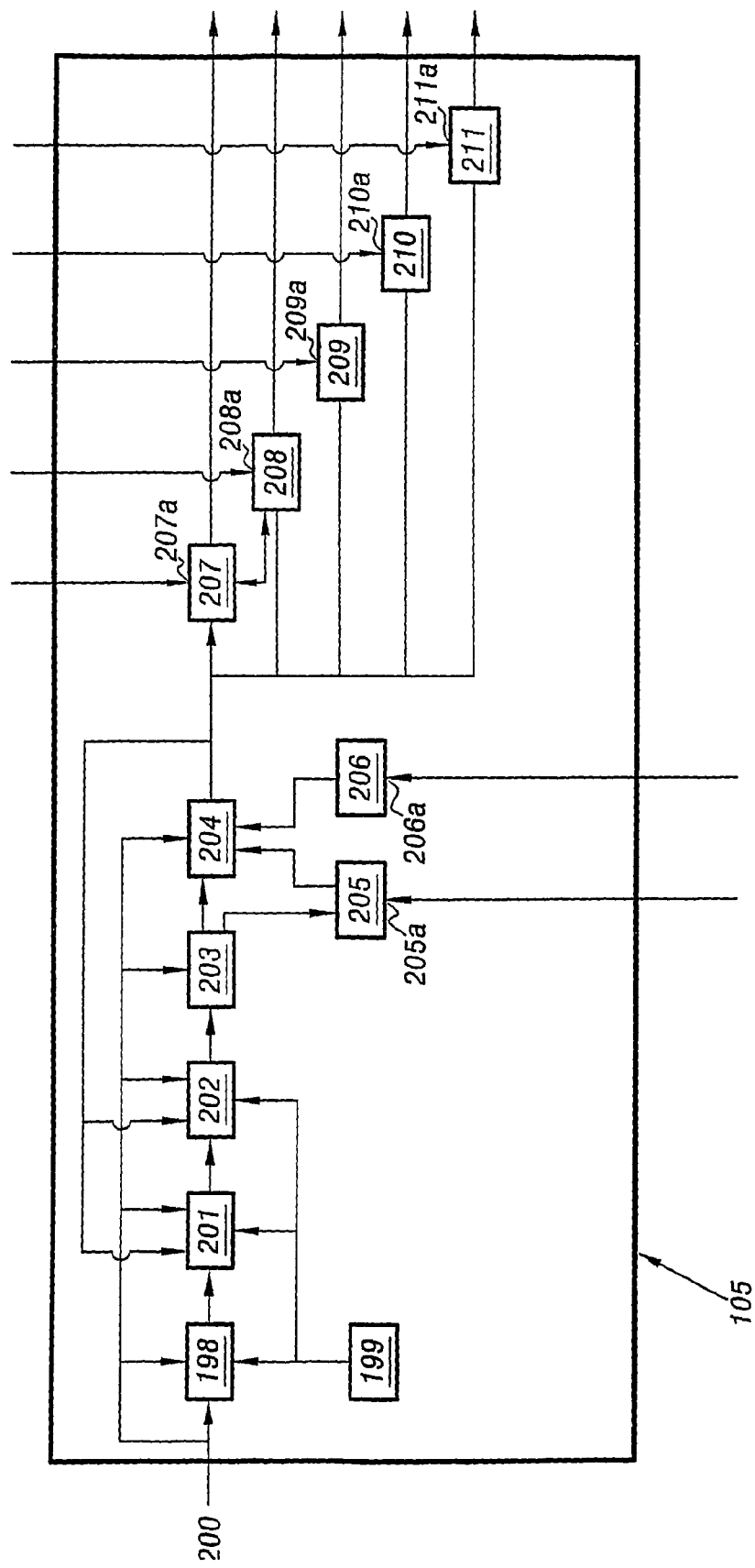
FIG. 6 is a basic diagram of the data processing unit used in the formation of the printer shown in FIG. 5.

The data processing unit 105 in FIG. 5 will now be described with reference to FIG. 6.

A computation unit 198, adapted, in particular, to cut up a 3D representation of the component to be produced into characteristic objects has as its inputs said 3D representation, the production specification of the component, parameterised in the form of digital data, and is connected to a database 199. The database 199 contains all the results of investigations carried out prior to production of said component. These investigations relate to the choice of optimum values of printing parameters as a function of the nature of the materials, the characteristics of the printer and the deposition conditions.

Said 3D representation and the production specification are input at a user input 200 or may be stored in a memory unit of the data processing unit.

The computation unit 198 is also adapted to slice the 3D representation of the component and to determine, as a function of the input data and the information stored in the database 119 about the component to be produced, the print layers to be printed successively and all of the printing parameters by employing, for example by means of software, the stage of slicing the 3D representation of the component to be produced of the method according to the invention as described hereinbefore with reference to FIG. 1.

The user can enter, via the user input 200 or specific data stored in the database, some or all of the cutting up and slicing characteristics of the 3D representation such as the maximum printing thickness as described in the slicing stage of the method according to the invention.

All of the printing layers as well as all of the ranges of associated printing parameters and/or all of the parameters fixed at predetermined values, as described hereinbefore, are thus supplied to a computation unit 201 adapted to determine, for each print layer, a set of discrete spatial trajectories, an ejection height for the material droplets and a volume of ejected droplets by employing, for example by means of software, the stage of the method according to the invention as described hereinbefore with reference to FIGS. 3, 4A and 4B. This computation unit 201 is also connected to the database 199 and to the user input 200, the user being able to enter some or all of the characteristics of the discrete spatial trajectories such as the ejection step of a print layer, the volume of the ejected droplets, the angle of rotation θ, etc.

The user input 200 can advantageously consist of an appropriate man/machine interface.

The computation unit also determines all of the values of the printing parameters relating to the state of the materials in the tanks, in the printing head and once deposited, by employing, for example by means of software, the printing parameter determination stage of the method according to the invention as described hereinbefore with reference to FIG. 1.

The discrete spatial trajectories, the print layers and the associated printing parameters determined by the computation unit 201 or by the user are thus supplied to a computation unit 202 adapted to determine a law of spatial and temporal sequencing which is also connected to the database 199 and to the user input, the user being able to fix some or all of the characteristics of the sequencing law. This unit 202 determines the spatial and temporal sequencing law by employing the stage of determining the spatial and temporal sequencing law of the method as described hereinbefore with reference to FIG. 1. The spatial and temporal sequencing law is stored sequentially in the order in which the print layers are printed in a data storage unit 203.

A representation of the component produced in an ideal manner according to the spatial and temporal sequencing law determined by the computation unit 202 is also stored in the data storage unit 203. This representation serves as a reference for calculating and correcting printing errors.

A driving unit 204 is responsible for coordinating all of the storage, displacement and ejection means. This driving unit 204 is connected to the data storage unit 203 in order to read the stored sequencing law. It is also connected to a deposition surface morphology analysis unit 205. This analysis unit 205 receives from the morphology sensor 118 measurements of the deposition surface at an input 205a which allow it to reconstruct said deposition surface. The reconstructed deposition surface is then compared with the deposition surface of the ideal representation of the component stored in the unit 203. The analysis unit 205 then computes a differential deposition surface corresponding to the difference between these two deposition surfaces, determines, as a consequence, an additional print layer which is representative of the correction to be made and indicates to the driving unit 204 that a correction needs to be made.

In response, the driving unit 204 receives said additional print layer to be printed and sends it to the unit 201 for determining the discrete spatial trajectories which computes, as a consequence, a set of printing parameters, in particular the volumes of material which need to be deposited and consequently the sizes and shapes of ejected droplets, associated with a set of discrete spatial trajectories identical to the set of the discrete spatial trajectories of the printing layer which have just been printed. The parameters as well as the discrete spatial trajectories are thus stored in the storage unit 203 as being the first print layer which is to be printed. The driving unit 204 then reads said sequencing law and processes it.

The driving unit 204 also receives a cleaning request from a unit 206 for determining the degree of obstruction of the ejection means. This determination unit 206 regularly receives measurements from the means for acquiring the degree of obstruction of the ejection nozzles at an input 206a and determines whether the ejection means, i.e. at least one ejection nozzle, are obstructed. If so, a priority cleaning request is emitted. The driving unit 204 stops printing, stores, in the data storage means, the operating environment during the interruption, and controls the cleaning sequence which consists in parking the ejection means and proceeding to clean the ejection means. Once this sequence has been completed, the operating environment is reloaded and printing continues from where it was stopped.

In normal operating mode, the driving unit 204 reads the spatial and temporal sequencing law in the data storage unit 203 and consequently generates a set of reference signals for the displacement plates and the ejection nozzles.

The driving unit 204 also generates reference signals for the tanks and the ejection heads as a function of the values of the printing parameters associated with the sequencing law during processing.

A first reference signal is a signal representative of the spatial trajectory over the printing surface which the ejection means and consequently the first two plates travelling in a horizontal axis have to follow. This signal is sent to a control unit 207 implementing a control law for following a trajectory. This unit receives at an input 207a the measurements taken by the positioning sensor in the printing surface in order to employ the control law. This unit 207 consequently computes the appropriate control signal and sends it to the power controllers of the first two displacement plates.

A second reference signal is the vertical trajectory to be followed by the ejection means and therefore the plate for displacement along the vertical printing axis. This trajectory is constructed on the basis of the different ejection heights required for printing the print layers. This signal is then supplied to a unit 208 for controlling the third plate which also receives, at an input 208a, the measurements from the vertical positioning sensor for implementing a law for controlling the following of a trajectory, as before. This unit 208 therefore computes a control signal and transmits it to the power controller of the plate for displacement along the vertical axis. The control units 207 and 208 are also connected in such a way that they exchange synchronisation signals which allow the control signals of the plate to be synchronised so that the desired three-dimensional trajectory can be obtained.

A third reference signal is a reference signal for controlling the ejection nozzles. This signal is representative of the shape and size of the droplets to be ejected and therefore of the volume of the material droplets to be deposited and the instants of ejection thereof. This signal is supplied to an ejection nozzle control unit 209 which also receives the output from the control unit 207 for the first two displacement plates at an input 209a. This unit therefore allows generation of an ejection nozzle control signal synchronised with the control signal for the first two plates. The ejection nozzle control signal should be synchronised with the control signal for the first two plates since material droplets are ejected at predetermined points of the trajectory of these plates. For this purpose, the ejection nozzle control unit 209 can comprise, for example, a phase-locking loop which locks the ejection nozzle control signal to the control signal for the first two plates. The output of the nozzle control unit 209 is thus supplied to the voltage amplifiers of the printer ejection nozzles. It should be noted that displacement and ejection can also be synchronised by the driving unit 204.

A fourth reference signal is a reference signal for controlling the radiation source 130. This signal is representative of the wavelength of the emitted radiation, its energy, the duration of emission thereof and therefore its power and the instants of radiation emission and is supplied to the radiation source. This reference signal can consist in emitting a flash after each droplet deposition or after the deposition of a predetermined number of droplets. It can also consist in emitting constant radiation during production, as the case may be.

An ejection head temperature and pressure control unit 210 receives the temperature and pressure reference values from the driving unit 204 and is responsible for regulating the temperature and pressure of each ejection head as a function of these values. For this purpose, it receives data at an input 210a, from the various temperature and pressure sensors temperature and pressure measurements of the materials in the ejection heads and, in response, calculates the regulation signal necessary to regulate these various parameters about said reference values which it transmits to the ejection head temperature and pressure control means.

In the same manner, a unit 211 for controlling the temperature, pressure and stirring of the materials stored in the storage tanks receives from the driving unit 204 reference values for temperature, pressure and state of dispersion corresponding to the values required for the optimum conditioning of the materials in the storage tanks. This control unit 211 receives at an input 211a, from the temperature and pressure sensors and of the means for acquiring the state of dispersion, measurements of temperature, pressure and state of dispersion, and in response, calculates regulation signals for regulating the temperature, pressure and state of dispersion of said reference values and transmits them to the means for controlling temperature, pressure and stirring of the tanks, as will be explained in greater detail hereinafter.

Similarly, a unit for controlling the temperature in the chamber (not shown) receives from the storage unit 203 temperature reference values corresponding to the values required for printing the various print layers. This unit for controlling the temperature in the chamber receives temperature measurements from a temperature sensor in the chamber (not shown) and, in response, calculates regulation signals for regulating the temperature around said temperature reference values in the chamber and transmits them to the chamber temperature control means.

In addition, the outputs of the control units 210 and 211 and of the chamber temperature control unit may be selectively deactivated to allow the user to manually adjust the temperature, pressure and stirring of the materials in the storage tanks, the pressure and temperature of the materials of the ejection heads and the temperature in the chamber by means provided for this purpose in the tanks, the ejection heads and the chamber.

The description of the data processing unit 105 is a functional description thereof. The means which make it up can be implemented, by means of software or hardware and may be distributed in various components of the device. The computation units 198, 201, 202, 203, the analysis unit 205, the unit 206 for determining the degree of obstruction of the ejection means and the database 199 can thus be implemented by means of software on a personal computer and the various control units 207 to 211 as well as the chamber temperature control unit can be integrated in the form of a printed circuit board in the means which they are responsible for controlling.

These control units can also be implemented in the form of software in a PC which can be the PC described hereinbefore.

The following description provides details about the material storage tanks and the ejection heads according to the invention which allows the various above-described functions to be fulfilled advantageously.

Figure 7:
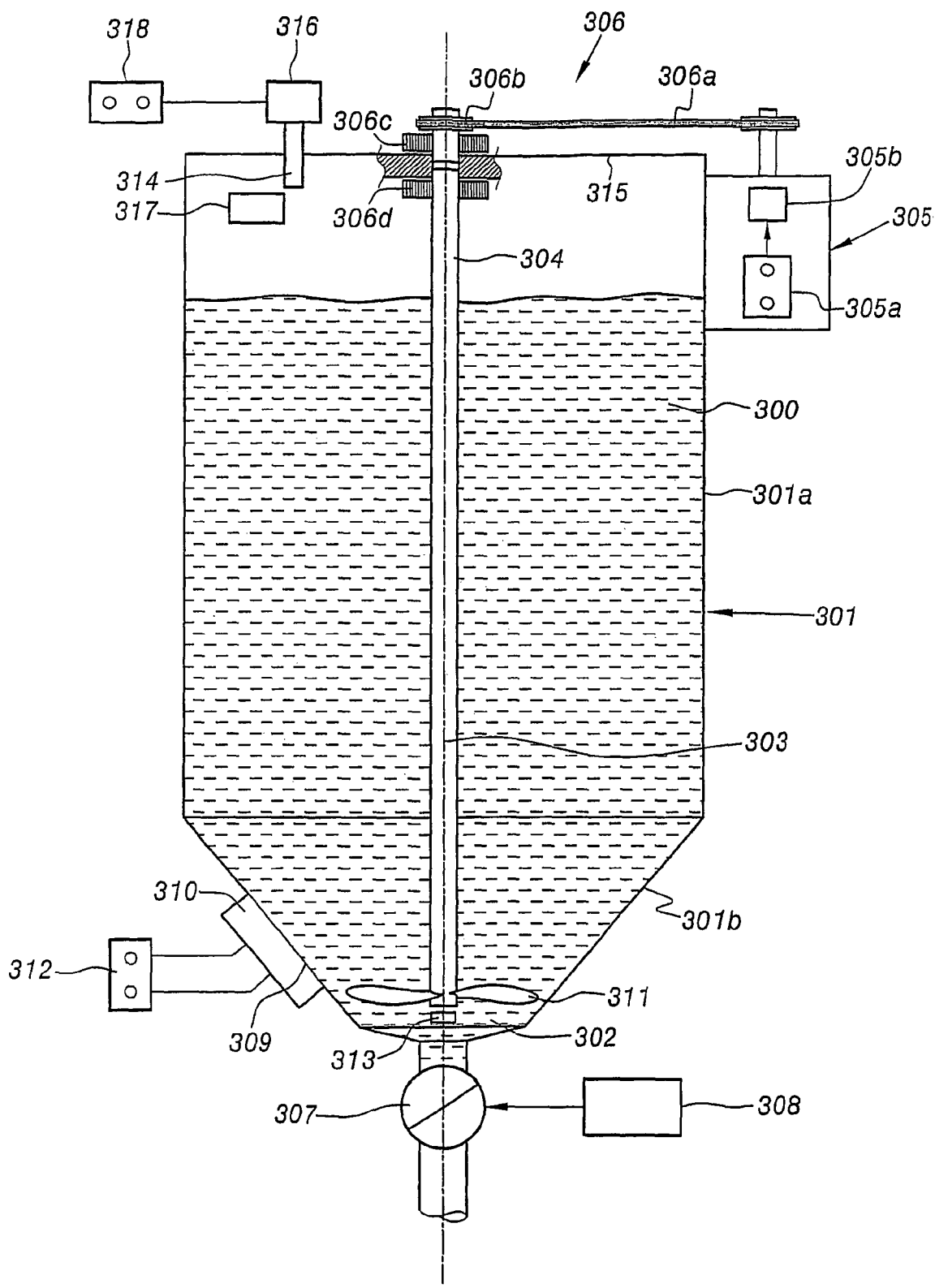
FIG. 7 is a schematic view of a material storage tank for an ink-jet-type printer used in the formation of the printer shown in FIG. 5.

FIG. 7 is a cross-section view of a storage tank for an ink-jet-type production device according to the invention. The tank comprises a container 300. The container has an internal surface 301 defining a volume which is preferably generated symmetrically by revolution in order to avoid folds or angular zones which are likely to define a region where stored material can stagnate, for example a cylindrical portion 301a extended by a conical portion 301b which serves to direct the stored material toward an outlet orifice 302 to allow the discharge of the stored material from the tank.

In the region of its axis of symmetry 303, the tank comprises a shaft 304 which is internal to the tank and is set into rotation by a drive motor 305 provided with an output shaft by means of a magnetic drive system 306. This magnetic drive system comprises a belt 306a between the output shaft of the motor 305 and a shaft 306b disposed outside the tank along the axis of symmetry 303. The shaft 306b is disposed in such a way that one of its ends faces an upper end of the shaft 304, these two ends of the shaft 306b and the shaft 304 being adjacent to the upper wall 315 of the tank.

A set of permanent magnets 306c, 306d is fixed to each end of the shaft 304 and the shaft 306b adjacent to the upper wall, in such a way that, when the shaft 306b is set into rotation by the belt 306a when the output shaft of the motor 305 is in rotation, the shaft 304 is also set into rotation.

This driving system of the shaft 304 is particularly advantageous because, on the one hand, it allows the motor 305 and the shaft 304 to be arranged separately and, on the other hand, it provides a better seal, even when there is excess pressure in the tank, owing to the fact that the shaft is not set into rotation by a system requiring an opening in the upper wall of the tank, such an opening requiring a specific sealing system.

The shaft 304 is also extended to the outlet orifice 302 and, in the region of this outlet orifice 302, a stirrer blade 309 is fixed to said rotating shaft 304. The rotating shaft, the drive motor, the magnetic drive system and the stirrer blade form stored material stirring means. They allow the state of dispersion of the stored material to be controlled and reduce the likelihood of the occurrence of agglomerates of particles and of a sedimentation phenomenon which is likely to occur in certain materials.

The drive motor is typically a direct current motor because the stirring of the materials commonly used in production by ink-jet-type printing does not necessitate strong output torques of the engine and high speeds of rotation and consequently high powers. The voltage of the drive motor is controlled and the drive motor comprises a conventional control interface 305a which is connected to a voltage source which supplies a voltage representative of a speed of rotation characteristic of the desired state of dispersion of the material and a control circuit 305b which receives said supplied voltage as a reference for controlling said drive motor.

The state of dispersion of the material is controlled by using the motor control properties. The shearing of the material by the stirring blade 311 has the effect of generating a torque which is resistant to the engine output torque of which the intensity is dependent on the state of dispersion of the materials stored in the reservoir. The drive motor control circuit comprises a conventional loop for regulating the speed of rotation and can comprise, in a cascade, an output torque regulating loop which ensures a constant speed of rotation corresponding to the delivered reference. This has the effect of regulating the dispersion of the material in a simple manner. It is obviously possible to imagine control of the drive motor to vary the speed of rotation as a function of a desired profile of the state of dispersion on the basis of the measurement of the resistant torque.

The outlet orifice 302 is also connected to a solenoid valve of which the opening 307 can be controlled and which controls the flux of issuing material. The degree and duration of opening of this solenoid valve can be controlled automatically or manually by opening control means 308, and this allows the quantity of issuing material to be controlled.

Also, in the region of the outlet orifice 302, the tank wall has a zone 309 of reduced thickness to which is applied, on the exterior of the wall, a heat exchange surface of a temperature control module 311 comprising a Peltier-effect module. This temperature control module 311 can also comprise a heating plate to heat the stored material and thus extend the temperature range for the stored material. The reduced thickness of the zone 309 allows easy heat exchange between the material stored inside the reservoir and the temperature control module 311 without an opening being made in the reservoir wall.

The Peltier-effect module and the heating plate are connected to a control interface 312 which can be connected to a source of signals and delivers a signal representative of the desired quantity of heat exchanged between the temperature control module 311 and the material per unit time.

A thermocouple 313 is also disposed in the region of the orifice to measure the temperature of the material in the region of the outlet orifice, which is representative of the temperature of the material during ejection. This thermocouple is connected to a data processing unit to which this sensor supplies the temperature measurements used to calculate the control signals which are then delivered to the control interface 312.

The benefit of positioning the stirring and temperature control means in the region of the outlet orifice is that the state of the material can be controlled precisely as it leaves the tank before it is distributed to the other components of the printer.

The tank according to the invention also comprises an orifice 314 located in the upper wall of the tank. This opening is connected to a system 316 for controlling the pressure of the stored material. To control said pressure, one method consists in partially filling the tank with material and controlling the pressure of the gas present in the "free" region defined between the material and the upper internal surface 315 of the tank.

For this purpose the pressure control system 316 comprises a vacuum pump to pump the gas present in the free region and creates a vacuum and a compressor which injects compressed gas into the free region to create excess pressure. A gas pressure sensor 317 for measuring the gas pressure of the free region is disposed in this free region. It supplies measurements to a control circuit adapted to control the pressure of the gas present in the free region by controlling the vacuum pump and the compressor as a function of a desired gas pressure value. Said desired gas pressure value is input by means of a control interface 318 for the pressure control system 316 connected to a source of signals which delivers a signal representative of the desired gas pressure.

A material storage tank which contains a set of means for controlling the temperature, the pressure and the state of dispersion of the stored material has thus been described. The previously described embodiment corresponds to the most complete embodiment. Tanks comprising only a part of this set of means such as only the Peltier-effect module for the temperature control system and the compressor for the pressure control system also come within the scope of the present invention.

Figure 8:
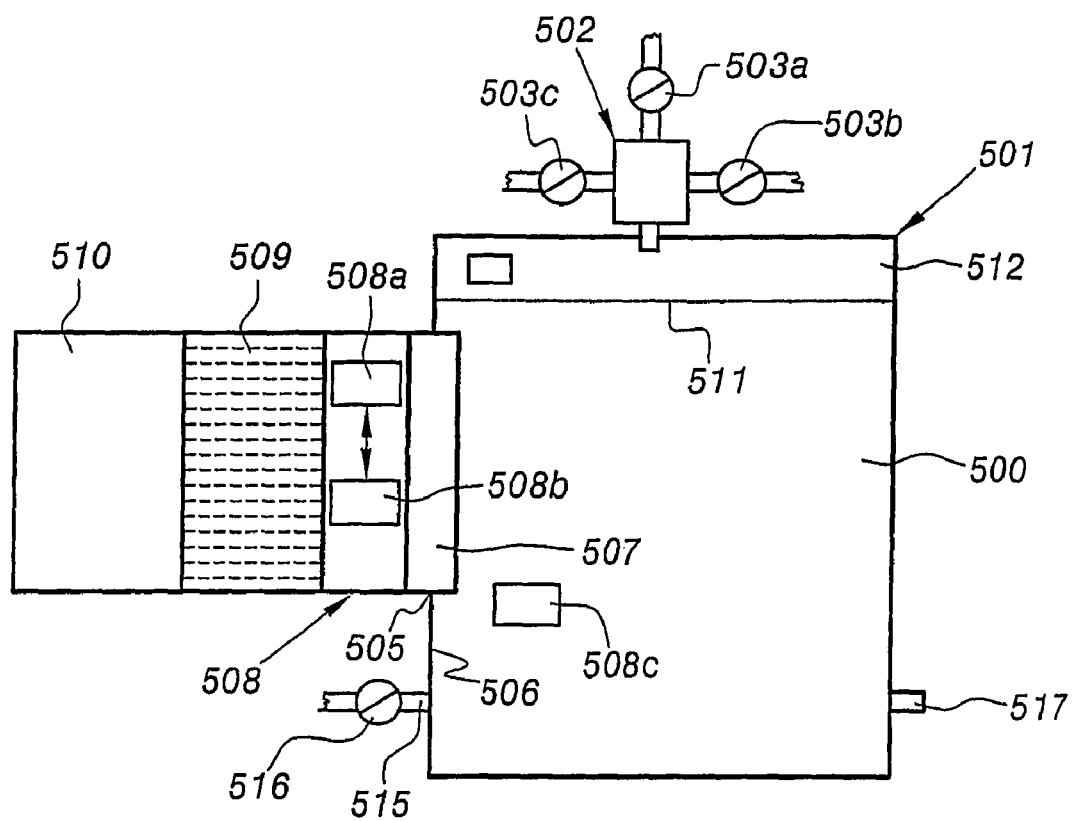
FIG. 8 is a schematic view of a printing head for an ink-jet-type printer used in the formation of the ink-jet-type printer shown in FIG. 5.

FIG. 8 is a schematic view of a preferred embodiment of an ejection head for an ink-jet-type production device according to the invention. In this embodiment the ejection head comprises a tank 500. In its upper wall 501, this tank comprises an intake 502 connected to a controllable solenoid valve 503*a* for the supply of material, to a controllable solenoid valve 503*b* for the supply of cleaning liquid and to a controllable solenoid valve 503*c* for connection to a gas pressure control circuit (not shown).

The internal wall 504 of the reservoir has an opening 505, preferably on the lateral portion 506 of the internal wall. This opening serves as a recess for a metal plate 507 for interfacing between the internal volume of the tank and consequently the material when the material is present in the tank and a Peltier-effect module 508. The voltage of this Peltier-effect module is controlled in the conventional manner, the module being connected to a control interface 508*a* which is adapted to receive from a voltage source, a voltage representative of the desired quantity of heat taken or delivered by the Peltier-effect module. The Peltier-effect module also comprises a control circuit 508*b* connected to the interface 508*a* and adapted to control the Peltier-effect module in order, for example, to regulate the temperature of the material in the tank around a desired temperature value which is delivered by the control interface 508*b* in the form of a voltage representative of said desired temperature value. For controlling the Peltier effect, the control circuit receives measurements originating from a temperature sensor 508*e*, for example a thermocouple, disposed in the tank 500 so as to be immersed in the material when the material is present in the tank.

The Peltier-effect module is arranged in a cascade with a heat dissipator 509, formed, for example, by a set of heat dissipating fins. This heat dissipator is itself arranged in a cascade with a fan 510 adapted to extract the heat dissipated by the heat dissipator.

When the material feed solenoid valve 503*a* is open, material originating from the material storage means (not shown) flows into the tank via the intake. The solenoid valve is closed once the level of material in the reservoir reaches a predetermined level shown here by a dotted line. This predetermined level is selected so that the surface of the metal interface plate 507 oriented toward the interior of the tank is completely in contact with the material and a free space 512 remains between this level and the upper wall 501 of the tank. This obviously assumes that the opening 505 in the internal wall of the reservoir is produced in a manner which makes this choice possible.

The free space between the material and the upper wall 501 is thus filled with gas, the pressure of which is advantageously controlled. By controlling this gas pressure, the material pressure in the region of the contact surface between the material stored in the tank and the gas in the free space 512 is also controlled, as is therefore the pressure of all the materials stored in the tank 500. It is essential to control the pressure of the material contained in the ejection head because the ejection nozzles generally require a predetermined material pressure, usually a predetermined vacuum, to function correctly.

The controllable solenoid valve 503*c* for connection to a gas pressure control circuit is connected to a gas pressure control circuit which comprises a gas compressor and a vacuum pump. To control the gas pressure in the free space, the solenoid valve 503 is opened and either the vacuum pump or the compressor is controlled as a function of the desired gas pressure. To obtain a vacuum, the vacuum pump is started up and a proportion of the gas present in the free space is drawn by the pump through the intake and the solenoid valve 503*c* until the desired gas pressure is obtained. To obtain an excess pressure, the reverse control is carried out, in other words the compressor is started up and sends a quantity of compressed gas into the free space via the intake and the solenoid valve 503*c* until the desired gas pressure is obtained.

The gas pressure control circuit comprises a control circuit which controls the controllable solenoid valve 503*c*, the pump and the compressor as a function of a desired reference pressure and pressure measurements delivered by a pressure sensor 512, for example a diaphragm sensor, disposed in the free space.

The pressure control circuit therefore forms with the free space a means for controlling the pressure of the material contained in the tank.

The tank also comprises a drainage outlet 515 connected to a controllable solenoid valve 516. To clean the tank, the feed intake and the discharge outlet for the material 516, the drainage solenoid valve 517 is firstly opened to drain the tank of the material which it contains. Once drainage has been completed, the controllable solenoid valve 503*b* for supplying cleaning liquid is opened and a cleaning liquid originating from a cleaning liquid reservoir flows into the tank and is discharged mainly via the drainage outlet, this operation constituting a first cleaning operation. The drainage solenoid valve 517 is then closed and the cleaning liquid fills the tank up to the level 511.

The pressure of the cleaning liquid is thus adjusted by the pressure control means in order to control the pressure of the cleaning liquid from the reservoir and thus allow the cleaning liquid to issue from the tank via the discharge outlet in order to clean said discharge outlet and the ejection nozzle or nozzles connected to the ejection head by said discharge outlet. If desired, it is also possible to control the temperature of the cleaning liquid present in the reservoir if necessary. The above-described cleaning system is therefore incorporated in the ejection head, avoids the use of a specialised cleaning station and affords the advantage of being compatible with a large number of models of ejection nozzle.

The notion of material obviously covers the most varied materials such as, in particular, ceramic systems, metal systems, polymers or other materials.

The invention claimed is:

1. A method for producing a three-dimensional multi-material component by the ink-jet-type printing of droplets of at least one material in successive layers, comprising the steps of:
   (1) cutting up a representation of the multi-material component into characteristic objects;
   (2) slicing the representation of the component into print layers as a function of said characteristic objects;
   (3) establishing a plurality of discrete spatial print path trajectories for each print layer;
   (4) establishing a set of printing parameters as a function of the nature of the materials deposited and the deposition conditions thereof for each print layer and for each discrete spatial trajectory; and
   (5) establishing a spatial and temporal sequencing law for a print path for said print layers and for said discrete spatial trajectories as a function of the objects, arranging the objects in a three-dimensional arrangement and the characteristics of the printer, in order to optimise the process of depositing each print layer,
   wherein the slicing of the representation of the multi-material composite consists in maximizing the quantity of materials deposited per print layer.

2. The method according to claim 1, wherein one of the printing parameters is the size and shape of the ejected material droplets, said method consisting in controlling the size and the shape of each droplet of materials to be ejected, as a function of the nature of the materials, the deposition conditions thereof and predetermined print layer thicknesses.

3. The method according to claim 1, wherein one of the printing parameters is the temperature of the materials prior to ejection, said method consisting in controlling the temperature of these materials prior to ejection of each droplet, as a function of the nature of these materials and the type of ejection means.

4. The method according to claim 1, wherein one of the printing parameters is the storage state of the materials, said method consisting in controlling the material state characteristics by controlling the temperature, controlling the pressure and controlling the state of dispersion of the stored materials as a function of their nature in order to optimise the material storage conditions.

5. The method according to claim 1, wherein one of the printing parameters is the state of the printing environment, said method consisting in controlling the characteristics of the environment in which the multi-material component is produced as a function of the nature of the deposited materials.

6. A method for producing a three-dimensional multi-material component by the ink-jet-type printing of droplets of at least one material in successive layers, comprising the steps of:
   cutting up a representation of the multi-material component into characteristic objects;
   slicing the representation of the component into print layers as a function of said characteristic objects;
   establishing a plurality of discrete spatial print path trajectories for each print layer;
   establishing a set of printing parameters as a function of the nature of the materials deposited and the deposition conditions thereof for each print layer and for each discrete spatial trajectory;
   establishing a spatial and temporal sequencing law for a print path for said print layers and for said discrete spatial trajectories as a function of the objects, arranging the objects in a three-dimensional arrangement and the characteristics of the printer, in order to optimise the process of depositing each print layer;
   determining a first modulation of discrete spatial print path trajectories for each print layer;
   determining at least one predetermined direction of discrete spatial print path trajectory for each print layer; and
   determining a second modulation of the discrete spatial print path trajectory from a current layer to the following layer for two successive print layers of the same object, said second modulation depending on the number of constituent layers to be deposited for said object in order to optimise the cohesion of the final structure of said multi-material component.

7. The method according to claim 6, wherein said first modulation consists in determining a second discrete spatial trajectory by a spatial shift of the ejection step of a first discrete spatial trajectory.

8. The method according to claim 6, wherein said second modulation of the discrete spatial print path trajectory is a modulation of the print path direction defined for each print layer of the object relative to an orthogonal reference frame, each print layer being allocated a specific direction which differs from a preceding print layer to the following print layer of the object.

9. The method according to claim 6, wherein, for a successive ejection of at least one droplet of material at a predetermined ejection step, said second modulation consists of an amplitude and/or spatial shift modulation of said ejection step from a preceding print layer to the following print layer of the object.

10. A method for producing a three-dimensional multi-material component by the ink-jet-type printing of droplets of at least one material in successive layers, comprising the steps of:
   (1) cutting up a representation of the multi-material component into characteristic objects;
   (2) slicing the representation of the component into print layers as a function of said characteristic objects;
   (3) establishing a plurality of discrete spatial print path trajectories for each print layer;
   (4) establishing a set of printing parameters as a function of the nature of the materials deposited and the deposition conditions thereof for each print layer and for each discrete spatial trajectory; and
   (5) establishing a spatial and temporal sequencing law for a print path for said print layers and for said discrete spatial trajectories as a function of the objects, arranging the objects in a three-dimensional arrangement and the characteristics of the printer, in order to optimise the process of depositing each print layer,
   wherein the spatial and temporal sequencing law for print path of the print layers and the discrete spatial trajectories comprises a plurality of printing instructions and of successive cleanings of the ejection system.

11. A method for producing a three-dimensional multi-material component by the ink-jet-type printing of droplets of at least one material in successive layers, comprising the steps of:
   (1) cutting up a representation of the multi-material component into characteristic objects;
   (2) slicing the representation of the component into print layers as a function of said characteristic objects;
   (3) establishing a plurality of discrete spatial print path trajectories for each print layer;
   (4) establishing a set of printing parameters as a function of the nature of the materials deposited and the deposition conditions thereof for each print layer and for each discrete spatial trajectory; and
   (5) establishing a spatial and temporal sequencing law for a print path for said print layers and for said discrete spatial trajectories as a function of the objects, arranging the objects in a three-dimensional arrangement and the characteristics of the printer, in order to optimise the process of depositing each print layer,
   wherein one of the printing parameters is the ejection distance orthogonal to the deposition surface, said method consisting in regulating said ejection distance around nominal values, the nominal values being determined so as to optimise the deposition of the materials on the deposition surface.

12. A method for producing a three-dimensional multi-material component by the ink-jet-type printing of droplets of at least one material in successive layers, comprising the steps of:
   (1) cutting up a representation of the multi-material component into characteristic objects;
   (2) slicing the representation of the component into print layers as a function of said characteristic objects;
   (3) establishing a plurality of discrete spatial print path trajectories for each print layer;

(4) establishing a set of printing parameters as a function of the nature of the materials deposited and the deposition conditions thereof for each print layer and for each discrete spatial trajectory; and (5) establishing a spatial and temporal sequencing law for a print path for said print layers and for said discrete spatial trajectories as a function of the objects, arranging the objects in a three-dimensional arrangement and the characteristics of the printer, in order to optimise the process of depositing each print layer, wherein one of the printing parameters is the degree of obstruction of the ejection system, said method consisting in cleaning the ejection system once the degree of obstruction exceeds a predetermined obstruction threshold value.

13. A method for producing a three-dimensional multi-material component by the ink-jet-type printing of droplets of at least one material in successive layers, comprising the steps of:

(1) cutting up a representation of the multi-material component into characteristic objects;

(2) slicing the representation of the component into print layers as a function of said characteristic objects;

(3) establishing a plurality of discrete spatial print path trajectories for each print layer;

(4) establishing a set of printing parameters as a function of the nature of the materials deposited and the deposition conditions thereof for each print layer and for each discrete spatial trajectory; and (5) establishing a spatial and temporal sequencing law for a print path for said print layers and for said discrete spatial trajectories as a function of the objects, arranging the objects in a three-dimensional arrangement and the characteristics of the printer, in order to optimise the process of depositing each print layer, wherein one of the printing parameters is the power and wavelength of a radiation applied to the deposited materials as a function of the nature of the deposited materials.

* * * * *